United States Patent [19]

Borodovsky

[11] Patent Number: 4,767,215

[45] Date of Patent: Aug. 30, 1988

[54] LENS CHARACTERIZATION APPARATUS AND METHOD

[75] Inventor: Yan Borodovsky, Portland, Oreg.

[73] Assignee: Ateoq Corporation, Beaverton, Oreg.

[21] Appl. No.: 871,810

[22] Filed: Jun. 9, 1986

[51] Int. Cl.[4] ............................................. G01B 9/00
[52] U.S. Cl. ...................................................... 356/124
[58] Field of Search ................................ 356/124–125; 250/231 SE, 237 G, 211 K

[56] References Cited

U.S. PATENT DOCUMENTS

| | | | |
|---|---|---|---|
| 4,203,666 | 5/1980 | Ili et al. | 356/124 |
| 4,272,190 | 6/1981 | Shapiro | 356/124 |
| 4,641,964 | 2/1987 | Mitani et al. | 356/127 |
| 4,654,525 | 3/1987 | Ebina et al. | 250/237 G |

Primary Examiner—R. A. Rosenberger
Assistant Examiner—Crystal Cooper
Attorney, Agent, or Firm—Blakely, Sokoloff, Taylor & Zafman

[57] ABSTRACT

A beam of light, such as a laser, is used to scan across a lens. The beam passing through the lens is modulated by an optical encoder which controls the amount of the beam passing through the encoder to a light receptor. The received light is quantified and processed to determine any distortion caused by the lens. The encoder is comprised of a set of transparent windows upon an opaque face, the windows having a certain pattern that a beam travelling across the windows casts a specific light intensity pattern. The encoder also allows determination of astigmatism of the lens and distortion inherent in the beam itself.

24 Claims, 5 Drawing Sheets

LENS CHARACTERIZATION APPARATUS AND METHOD

BACKGROUND OF THE INVENTION

1. Field of the Invention

This invention relates to the production of precise optical components and assemblies, such as laser scanner devices, microphotolithography devices, microscope devices, etc. More particularly, this invention relates to the testing of aberrations present in such systems.

2. Prior Art

It is customary to judge the lens quality on the basis of interferometric evaluation. Although such technique is very sensitive to even minute aberrations in the system, the data interpretation with respect to the value of the particular aberration, such as distortion or astigmatism, is extremely difficult, especially in the case of multicomponent optical assemblies.

A recent use of laser scanning systems for laser printing and semiconductor chip fabrication relies on the optical systems where negative distortions are introduced on purpose. A deviation of the exhibited distortions in the real lens of this kind from the designed one for more than 0.05 microns could be unacceptable for a lens use. Diffraction limited microreduction lenses used on photolithography stage of semiconductor chip manufacturing must have a distortion less than 0.2 microns anywhere in the usable field and minimal amount of aberrations overall. Therefore, it is appreciated that there remains a need for a method which allows quantitative analysis of lens and lens assembly aberrations, particularly distortions in micron and submicron distortion ranges.

SUMMARY OF THE INVENTION

The present invention provides an apparatus and a method for performing a precision quantitative measurement of a lens distortion and other inherent lens aberrations. The present invention also provides for an apparatus and a method to analyze the laser beam quality degradation in the tested optical system. In accordance with the apparatus and method of the present invention, a lens (or a lens assembly comprised of several lenses, and hereinafter referred to as a lens) is placed in the laser scanning device equipped with an optical encoder, light sensor and information storage to record and manipulate the sensor output waveform. The lens is placed in a fixed position such that a scanner provides for a beam to travel across a face of the lens. An encoder placed beyond the scanner in the lens provides encoding of the lens' output beam. A light sensor located behind the encoder receives the encoded beam and generates electrical signals proportional to the intensity of the encoded light. The light sensor output is transmitted to a digitizer for analog-to-digital conversion and this digitized information is processed by a computer.

The encoder is comprised of a set of transparent windows or openings defined upon an opaque face, the windows having a certain pattern that a beam travelling across the windows casts a specific light intensity pattern which is received by the light sensor located behind the encoder.

DETAILED DESCRIPTION OF THE PRESENT INVENTION

The present invention provides for an apparatus and a method for performing a precision quantitative measurement of a lens distortion and other aberrations inherent in the lens, and further provides for analyzing the laser beam quality degradation in the tested optical system. Although a particular test configuration and sequence are described, many variations exist within the spirit and scope of the invention. It will be obvious to one skilled in the art, however, that specific details are not required to practice the present invention. In other instances, well-known structures and circuits are not described in detail in order not to obscure the present invention in unnecessary detail.

Figure 1:
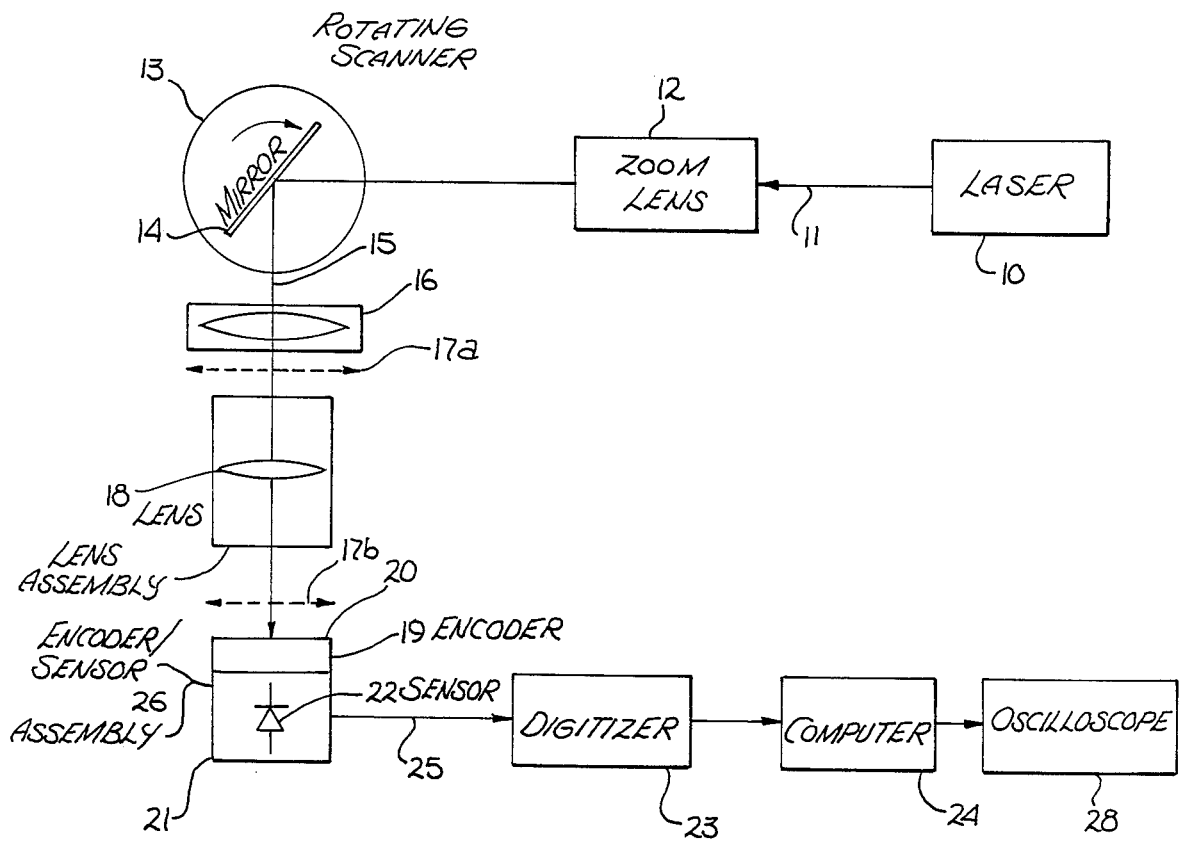
FIG. 1 is a physical layout of the apparatus as used in the preferred embodiment.

FIG. 1 illustrates the basic test configuration as used in the preferred embodiment. A light emitting device, such as a laser 10 is used to produce a beam of light. A laser beam 11 passes through zoom lens 12 to rotating scanner 13. Zoom lens 12 may be any lens apparatus having a zoom capability to adjust the size of laser beam diameter located on the face of a mirror 14. Scanner 13 contains mirror 14 which rotates causing single beam 11 to become a scanning beam 15. Mirror 14 is a highly-polished mirror mounted onto scanner 13. Scanner 13 is a precision rotating device which rotates at a constant velocity. Scanner 13 is constructed from ordinary components which are well-known in the prior art and are commercially available.

As scanning mirror 14 rotates on the scanner 13, the scanning beam 15 passes through the telecentric flat field scan lens 16 and as a result of the sweep, forms a linear scan 17a which is located in the focal plane of the scan lens 16. The length of the linear scan 17a is $L = 2f\phi$, wherein f=focal length of lens 16 and $\phi$=half field angle of the lens 16. The above-described section of the apparatus presents the classic preobjective laser scanner as described in (1) Donald C. O'Shea; *Elements of Modern Optical Design;* John Wiley & Sons, 1985.

A lens (or lens assembly) 18 under test is located between the scan line 17a and optical encoder 19. As beam 15 sweeps through the lenses 16 and 18, lens 18 which is under test effectively projects the image of the scan line 17b across a face 20 of encoder 19. The sweeping beam 15 passes through openings on the face 20 to sensor 21. Sensor 21 is mounted directly behind encoder 19. Sensor 21 which performs as a light receptor contains photodiode 22. Photodiode 22 which is an ordinary photodiode, generates a photocurrent proportional to the light flux reaching photodiode 22.

The analog photocurrent is coupled to a digitizer 23 on line 25 which converts the analog signal to a digital form for processing by computer 24. Most any prior art digitizer and processor may be used. A video display device 28, such as an oscilloscope, may be coupled to the computer 24 to view video displays of the photocurrent signal. Most any commercially available video display device may be used. Further, digitizer 23, computer 24 and oscilloscope 28 may be combined in a single unit.

Although zoom lens 12 and rotating scanner 13 are used in this particular embodiment, these devices are not required for practicing the present invention. What is required is for laser 10 to generate a beam 15 which moves across the face of lens 18, thereby causing beam 15 to travel across face 20 of encoder 19 after passing through lens 18. Further, many devices may be utilized for sensor 21. In this particular embodiment, the photodiode 22 is used to generate a current which is proportional to the amount of light of beam 15 reaching it. Further, for testing any flat field lens itself, the lens to be tested will be placed in position to replace scan lens 16.

Figure 2:
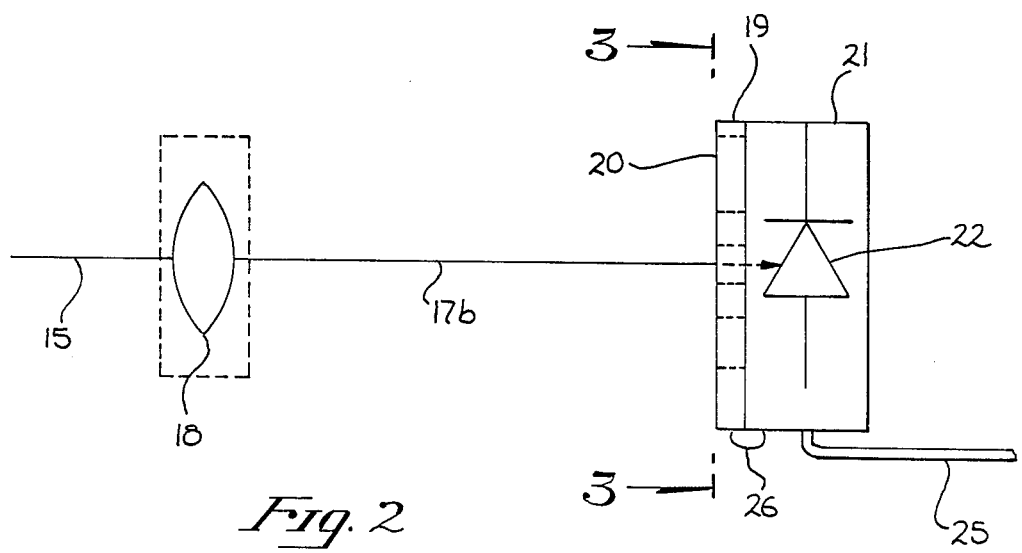
FIG. 2 shows the positioning of an encoder and a light receptor in reference to a lens and a beam.

Referring to FIG. 2, the positioning of the lens 18, encoder 19 and sensor 21 in reference to the beam 15 is shown. Lens 18 (which may be mounted within a lens assembly) is placed such that beam 15 travels across one of the axes on the face of lens 18. Encoder 19 is positioned in such a way that face 20 coincides with the scan line image 17b. Although any type of holding mechanism may be utilized to position encoder 19, the preferred embodiment utilizes a device which allows for the adjustment of the placement of encoder 19 during a test cycle. Sensor 21 containing diode 22 is mounted directly behind encoder 19 and operates as a single assembly 26 for positioning purposes. Signal line 25 couples analog signal from diode 22 to digitizer 23 of FIG. 1.

Figure 3:
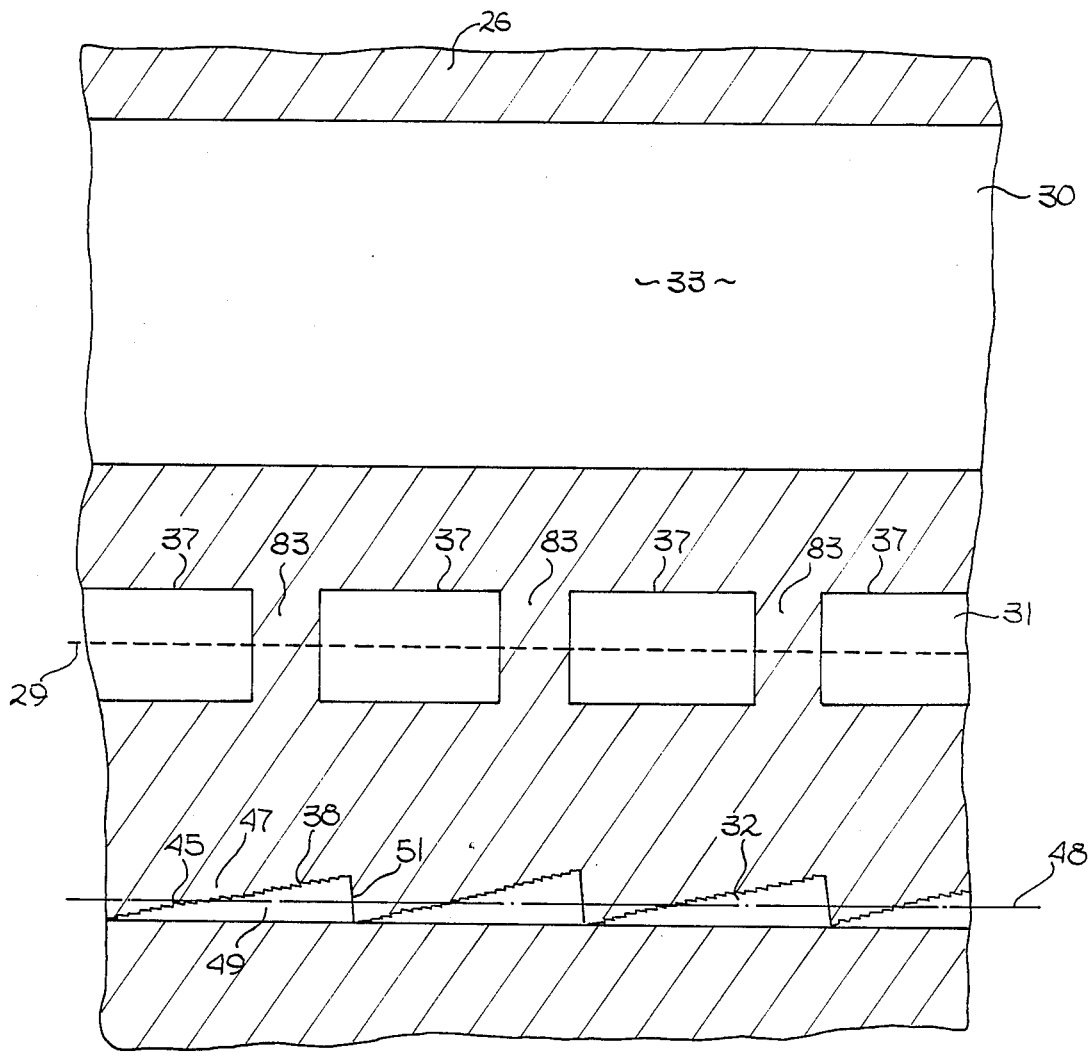
FIG. 3 is an elevation view of the front face of the encoder taken across section 3—3 of FIG. 2 showing three sets of openings on the front face.

Referring to FIG. 3, FIG. 3 illustrates the face 20 of encoder 19. Face 20 is formed from an opaque material bonded to a substrate which is transparent to a laser beam wavelength used in the test. A variety of well-known etching techniques may be used to define alignment and encoding geometries in the opaque layer. In this particular embodiment, the encoder is formed using e-beam lithography on a chrome-on-glass mask. In the preferred embodiment, face 20 has three transparent regions 30, 31 and 32, regions which are transparent to the laser beam wavelength used in the test, referred to in the following text as windows. An initialization window 30 consists of a large transparent area 33. It could be of any shape as long as its size is considerably larger than the length of the scan line image 17b produced by lens 18 under test at its image plane as shown in FIG. 3. The sole purpose of initialization window 30 is to provide for a coarse alignment of the encoder 19 to the scan line image 17b produced by the lens under test. In the preferred embodiment, transparent area 33 is rectangular in shape having a width of 3 mm and a height of 2 mm.

Alignment window 31, having a plurality of transparent rectangular regions 37 arranged in a row, is used for the purpose of fine aligning. In the preferred embodiment, alignment window 31 consists of rectangular regions 37, each having a width of 0.5 mm and a height of 5 microns. Also in the preferred embodiment, each rectangular region 37 is separated by opaque regions 83, wherein each are 10 microns wide to provide for a plurality of regions 37. The geometry of the opaque 83 and transparent regions 37 in the window 31 must be positioned in such a way to provide appropriate beam encoding by allowing scan line image plane to be in the same plane as alignment window 31 as shown by dashed lines 29. It provides information sensitive to the mutual orientation of scan line image produced by lines 17b and fine alignment window 31. Although the alignment window 31 of the preferred embodiment has specific measurements, what is required is for the total length of the alignment window 31 to be larger than the length of the image of the scan line 17b produced by lens 18 as shown in FIGS. 1 and 2. The width of the alignment window 31 should be close to the laser beam waist size at the lens 18 scan line image plane.

The actual lens characterization is provided by window 32. Window 32, having a geometry of opaque and transparent regions provides appropriate beam encoding to evaluate the aberration characteristic of the lens 18 when the beam passes through lens 18 and window 32. In the preferred embodiment, the characterization window 32 is comprised of a plurality of sawtooth shapes 38. Further, each sawtooth 38 includes a plurality of complex multiple steps 45 along its rising edge 47. The total height of the sawtooth 38, as well as the step length of each step 45 must be larger than the beam waist size at the scan line image plane 17b produced by beam 15. The length of each transparent region 49 is 90 microns and each rising edge 47 is formed by 30 equal steps 45, wherein each step 45 is three microns long and has a height of 0.1 microns. The dimensions of the preferred embodiment correspond to a waist size at the image plane 17b which is equal to 2 microns for proper encoder operation.

The encoder 19 and sensor 21 are mounted as a single assembly 26 in a holder which provides six degrees of freedom of movement for these units. The holder (not shown) of this kind are commonly used in optical laboratory practices and provides for translations of orthogonal (linear) and rotational directions. A particular holder in use with the preferred embodiment utilizes three translations in orthogonal direction and three rotational translations around three different axes to align the assembly 26 to a focal plane for various characterization requirements.

Referring to FIGS. 1, 2 and 3, in actual practice assembly 26 is first positioned in such a way that beam 15 sweeps across the initialization window 30 and generates photocurrent in the photodiode 22. The photosensitive area of photodiode 22 must be larger than the total area occupied by the aligning and encoding geometries of an encoder 20 so that all of the beam 15 passing through the encoder-sensor assembly 26 is received by photodiode 22.

Beam 15 sweeping through the initialization window 30 will produce photocurrent in the sensor 21 and corresponding electrical pulses of a certain duration on the oscilloscope 28. The duration of this pulse is a function of scanner rotation rate and the parameters of flat field lens 16 and lens 18 under test and can be easily calculated for a given case. The assembly 26 is moved in the holder with respect to the sweeping beam 15 until the duration of the observed pulse is equal to the calculated value. This ensures the purpose of initial encoder set up so that opaque area 26 of encoder 19 which surrounds window 30 does not obstruct the image of the scan line 17b produced by tested lens 18.

Figure 4:
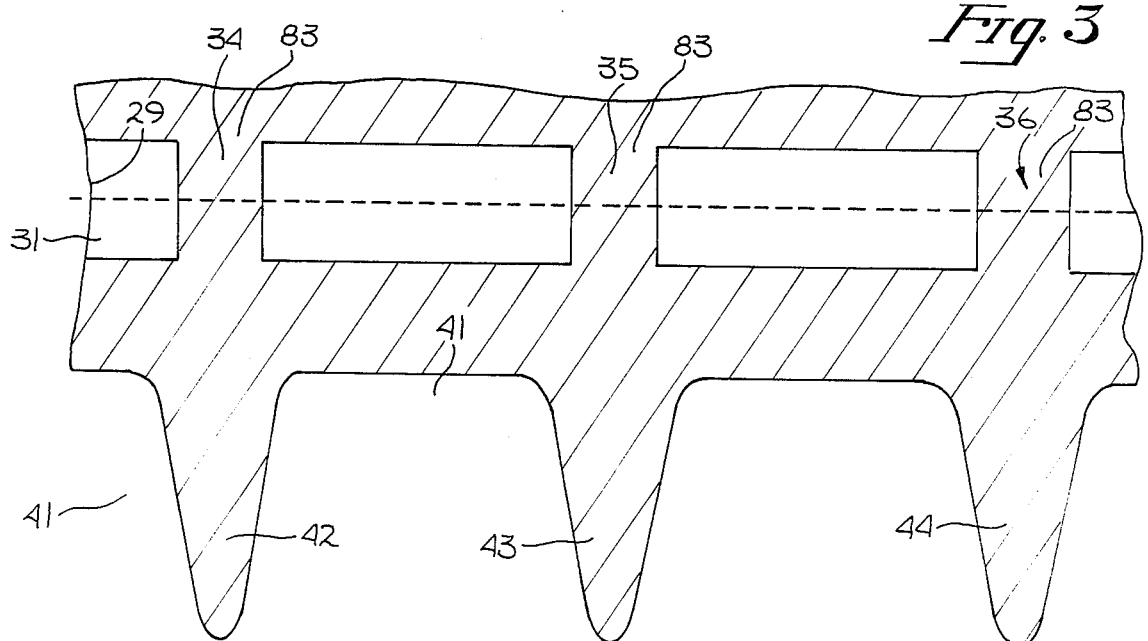
FIG. 4 is an elevation view of an alignment window which is part of the encoder of FIG. 3 and also illustrates a coding shape associated with alignment or testing a lens.

Once the initialization positioning occurs, assembly 26 is moved upward until beam 15 appears in the alignment window 31. Also referring to FIG. 4, this fact will manifest itself as specific electrical pulse series 41 corresponding to the alignment window geometry. The fine alignment window 31 is used to center the encoder 19 with the scan line image 29 such as to align the encoder plane (plane formed by the face 20 of the encoder 19) with the lens image plane and also to align the encoder geometry to the scan line image 29. The central opaque area 35 will produce the pulse dip 43 in the center of the electric pulse if assembly 26 is centered. Likewise area 34 produces dip 42 and area 36 produces dip 44. To align encoder plane to the lens image plane, the analysis of the duration of the falling or rising edges of the pulses 42, 43 and 44 are used. For the encoder 19 located in the lens 18 image plane 17b, the duration of the pulse fronts will be the shortest and the difference between pulse fronts will be smallest when the encoder plane coincides with the scan line image plane 29.

Alignment window 31 also allows alignment of window 31 orientation with respect to the scan line image 29. Due to the fact that the width of the alignment window is approximately the same size as the beam 15 at its plane, even small rotation and misalignment of the encoder with respect to scan line image 29 will produce partial obstruction of the sweeping beam and corresponding pulse series will have a pulse duration which is shorter than unobstructed pulse duration in the case of such rotational misalignment.

Once the encoder plane is aligned to the scan line image plane 29 in fine alignment window 31, geometry is aligned properly to the scan line image 17b produced by the tested lens 18. Then the assembly 26 is moved upwards until the sweeping beam 15 moves across the characterization window 32 along the scan line trajectory 48.

Figure 5:
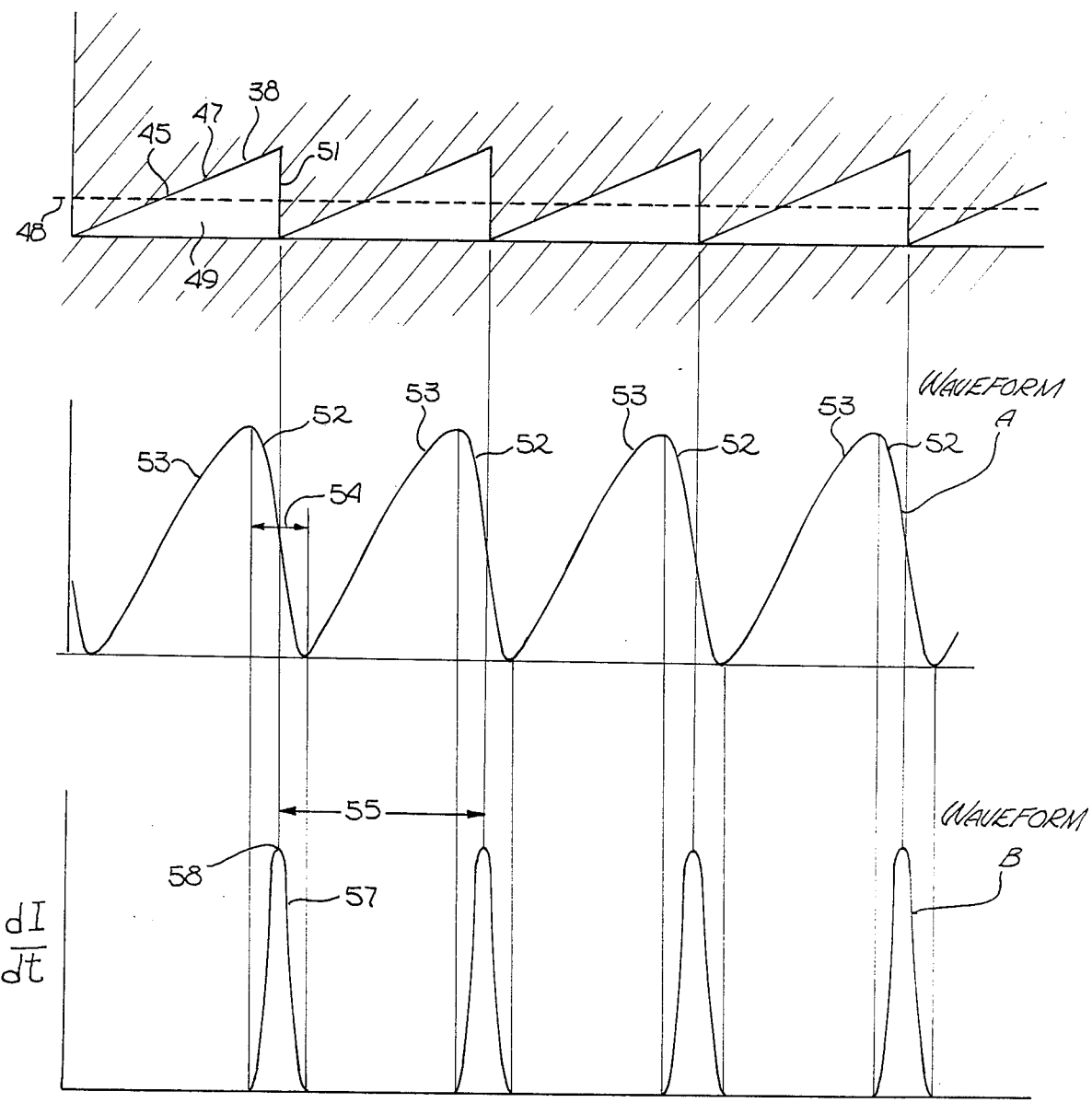
FIG. 5 is an elevation view of a portion of the characterization window of FIG. 3 and also illustrates coding shapes associated with encoding a beam.

Referring to FIGS. 1, 2 and 5, FIG. 5 shows an enlargement of the portion of window 32. As beam 15 sweeps along its trajectory 48, the rising edges 47 and trailing edges 51 of the sawtooth 38 modulate the light flux to the sensor 21. In the instance that sensor 21 electrical output is directly proportional to the light flux, the sensor 21 electrical output will produce a waveform A as shown in FIG. 5. The amplitude of the electrical signal for the given beam position will be proportional to the non-obstructed area of the beam. The analysis of the plurality of the trailing edges 52 of waveform A provide information on the distortion characteristic of the lens 18 under test and the laser beam 15 size in the direction of the scan. The analysis of the rising edges 53 allow the evaluation of the laser beam spot size in the direction perpendicular to the scan direction. Since the total height of the trailing edges 51 is larger than the beam size, and the length of the first sawtooth step 45 after the trailing edge 51 is also larger than the beam size, the beginning of each sawtooth pattern 38 present an obstructing knife edge.

From the following references, (2) Donald K. Cohen et al; Appl. Opt., Vol. 23, No. 4; and (3) Y. Suzaki and A. Tachibana; Appl. Opt., Vol. 14; it is known that in such an instance the derivative of the waveform to time (dI/dt) in these regions 54 correspond to the Gaussian distribution of which the applicable parameters depend on the light intensity distribution in the beam 15. The peak position 58 of the Gaussian distribution 57 will coincide with the position of the trailing edges 51 and its width at $1/e^2$ power level of the maximum derivative value will be equal to the laser beam spot size in the encoder plane in the direction of the scan.

For the described test configuration of FIG. 1, if the lens 18 under test has zero distortions and trailing edges 51 are equally spaced, the distance between the locations of Gaussian peaks 58 produced by the derivation of the observed waveform A in the corresponding region will also be equal as shown by waveform B of FIG. 5. The observed waveform B will be a waveform of constant period 55. If distortions are encountered in the tested area of the lens, the waveform period 55 will no longer be constant. The period 55 length will depend on the degree of positive or negative distortion inherent in the portion of the lens producing the corresponding part of the waveform. Consequently, the distance 55 between the Gaussian peaks 58 produced by the beam crossing trailing edges 51 will vary following the degree of distortion encountered in the lens. Correspondingly, the percent of the lens distortion across the lens field can be measured as described above.

The other aberrations present in the lens will manifest itself as an increase of the laser beam spot size in the lens image plane in these regions of the scan line image. Using the same waveforms A and B which are used to evaluate lens distortion, it is possible to measure the combined value of the other aberrations across the tested lens field, because the width at $1/e^2$ level of the Gaussian 57 is produced by the derivation of the observed waveform A in the vicinity of the trailing edges 51 is equivalent to the laser beam spot size produced in the considered part of the lens in the direction of the scan.

Until now the only portion of the characterization window 32, which essentially represents multiple-knife edge geometry, was used to measure the tested lens distortion and the sum of the rest of the aberration characteristics. Consequently, the complex stepped sawtooth encoder shape is not essential to extract the above-mentioned information. As a matter of fact, the fine alignment functions and characterization functions could be performed using the same encoder window having alternate multiple rectangular transparent and opaque regions as is shown as window 31 in FIG. 4. In the preferred embodiment, the stepped rising edges 45 of the encoder window is used to encode and later extract the information relating specifically to the astigmatic property of the tested lens, or in the instance when evaluation of the quality of the laser beam itself is desired.

Figure 6:
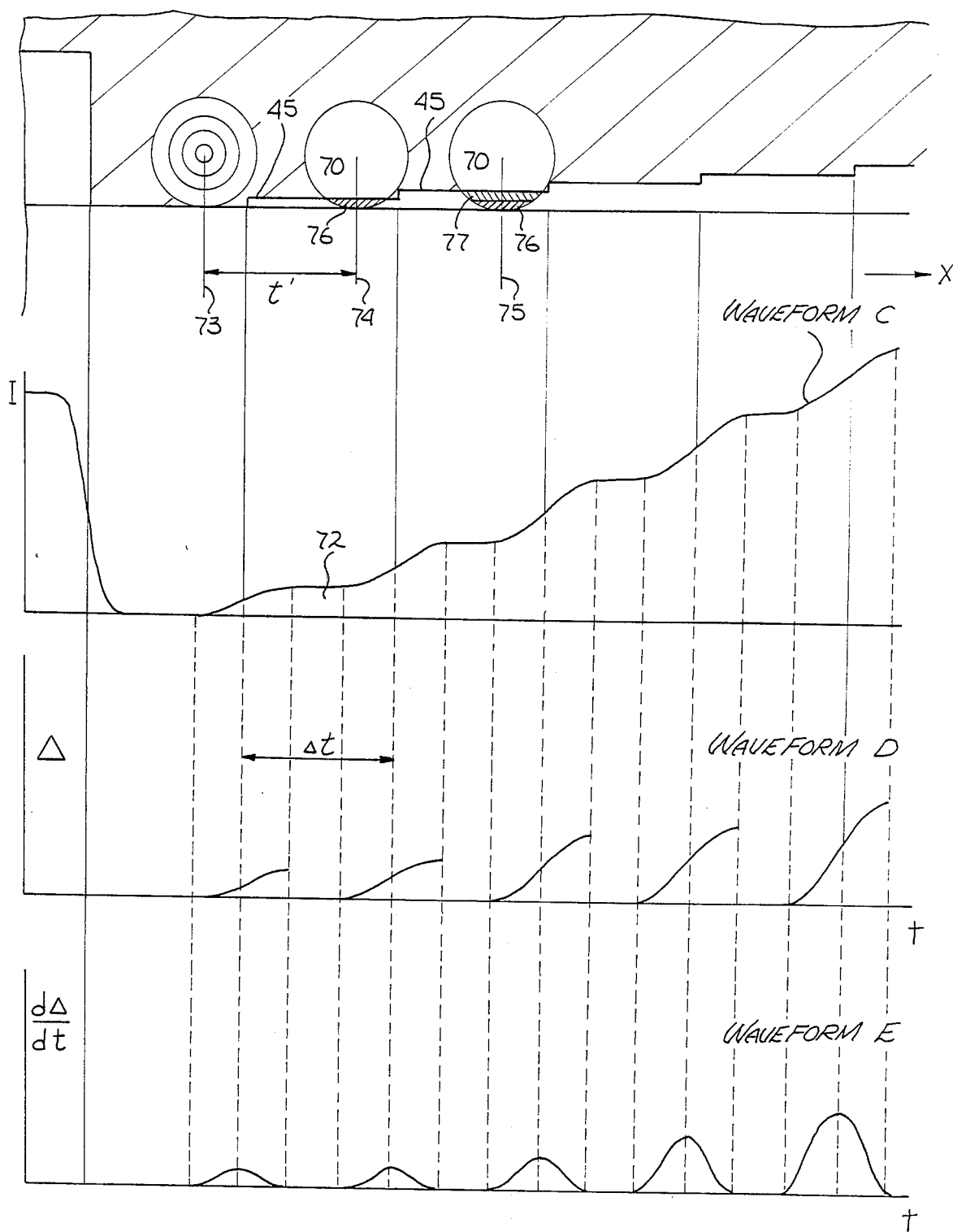
FIG. 6 is an elevation view showing a portion of the rising edge of the sawtooth shape of FIG. 5 and further showing the ramped steps present on the rising edge of the sawtooth figure and waveforms encountered for measuring the degradation of the laser beam.

Referring also to FIG. 6, each rising edge 47 of sawtooth shape 38 is formed by minutes steps 45. The length of each step 45 must be larger than the beam spot size 70 in the lens image plane 48. The height of each step will determine the resolution of the tested laser beam intensity mapping. The preferred embodiment has a plurality of rising edges 47, wherein each has 30 equal steps, such that each step has a height of 0.1 micron and a length of 3 microns. As the beam sweeps across the ramped steps 45, the value of the sensor electrical output at each particular moment of time will be proportional to the transmitted sensor beam power as discussed in knife edge technique above. The portion of the rising edge produced by the sensor 21's electrical output for the beam travelling along trajectory 48 across the steps 45 is shown in waveform C.

The steps 45 will "slice" the laser beam in the direction perpendicular to the beam motion. when the beam travels between points 73 and 74 in the proximity of the step, the value of the sensor 21's electric output at a given moment of time will be proportional to the power of the beam contained in the non-obstructed portion of the thin "slices" of the beam cross-section produced by the transmitting portion of the characterization window 33. The derivative (di) in reference to time t will correspond to the light intensity distribution in this initial "sliced" portion 76 of the beam. As the beam continues to travel between points 74 and 75, the sensor output at any given moment of time will be proportional to the sum of the power contained in the nonobstructed portion of the first 76 and second 77 "slices" of the beam.

If the method is provided to deconvolute this signal on its components corresponding to separate contributions of the first and second "slices" 76 and 77 to the formation of the waveform between points 74 and 75 at any given moment of time, the light intensity profile of the second "sliced" portion 77 of the beam could be found by derivation of its component in time. Such means are provided because the digitizer and computer are used to record and analyze the generated sensor output.

As the beam sweeps across characterization window 33, the sensor 21 output is digitized and the waveform C in the digitized form is stored in the digitizer memory and then transmitted to the computer memory. It is important that the digitizer is capable of storing complete waveform information within the chosen sampling rate. The constant beam scanning rate, constant digitizing sampling rate and the waveform storage in the digitizer or the computer memory provide the basis for such deconvolution. Simple computer programs can be used in such case to subtract the value of the signal recorded at any moment $t_1$ from the value recorded at the moment $t_1 + \Delta t$, where $\Delta t$ is the time which takes the beam to sweep across the length of one step. Waveform D illustrates the result of such subtraction, wherein waveform D represents deconvoluted contribution of the subsequent "sliced" portion of the beam to the formation of waveform C in the considered region. The derivation of this deconvoluted waveform D on time will correspond to the light intensity distribution in the subsequent "sliced" portions of the beam.

Figure 7:
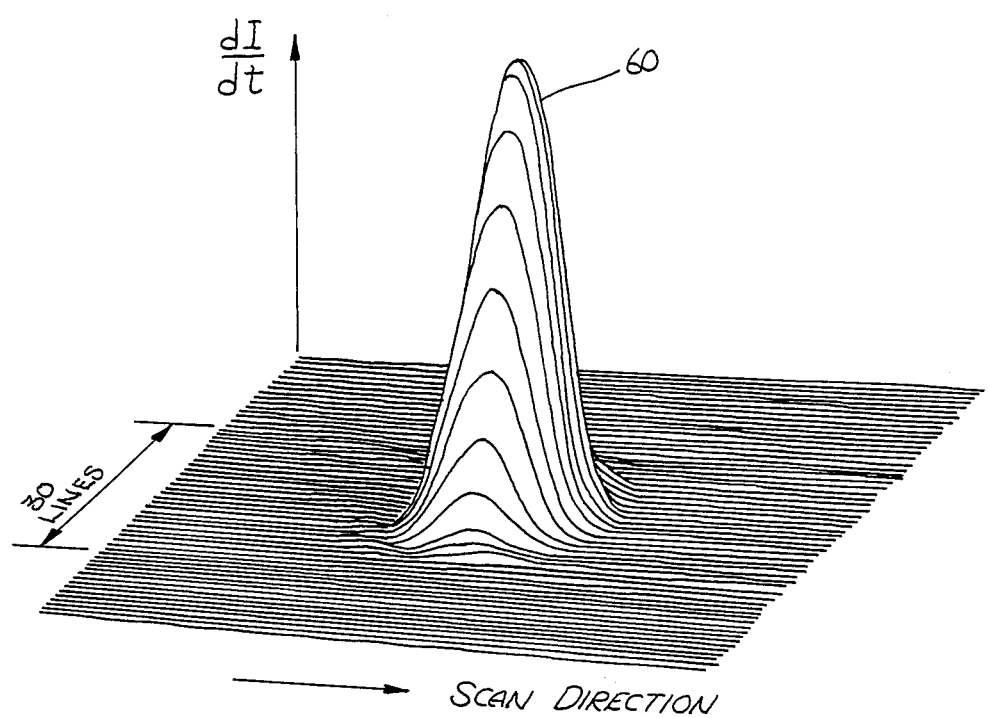
FIG. 7 is a pictorial view illustrating light intensity profiles as a three-dimensional presentation which is derived from processing digitized data.

Repeating the same routine, for all the steps and taking the derivative with respect to time on the subtraction result allows the reconstruction of the light intensity distribution in all 30 considered areas of the beam in the vicinity of each step 45 of each sawtooth pattern 38 as is shown in waveform E. Another computer subroutine is used to combine these light intensity profiles to compose three-dimensional presentation 60 of the light intensity distribution in the vicinity of every tooth of the sawtooth pattern 38, as is shown in FIG. 7. The above routine is used to establish the astigmatic properties of the tested lens. The width of the composed 3-dimensional Gaussian distribution at the $1/e^2$ level of the distribution maximum value is found in the direction of the scan and also in the perpendicular direction. The ratio represents the degree of astigmatism in the test lens associated with the particular part of the lens field. By applying the above procedure across the full length of the waveform, the degree of astigmatism can be found throughout the full field of the tested lens.

The analogous procedure can be used to evaluate the laser beam quality because the described procedure essentially produces the light intensity map of the laser beam passing through the encoder. For such evaluation, the encoder must be placed at the image plane of the telecentric flat field scanning lens 17 with the tested beam at the system input. In the preferred embodiment all above-described analysis and data manipulations are performed using the information supplied by a single waveform which is produced by a single scan across the characterization window. The waveform value is digitized "on a flight" with 16-bit analog-to-digital converter with the sampling rate at 10 kHz and 65,000 digitized data points are produced to represent an analog waveform which has a duration of 3 mm long scan line images. This and employed parametric Gaussian curve fitting routine allows lens distortions to be determined within an accuracy better than 0.03 microns across the field of the tested lens 18. Further, the same technique allows an evaluation of the laser beam spot size in both directions with an accuracy better than 0.1 micron.

All above-described characterization procedures are related to the instance when an encoder is placed at the tested lens image plane. Repeating the described procedure for the several different encoder positions when the encoder is moved from the tested lens image plane, other characteristics such as field curvature, depth of focus, telecentricity can be measured.

Thus, an apparatus and a method for measuring lens distortion, as well as other lens aberrations, other lens properties, and degree of laser beam degradation has been described. Once a particular axis has been characterized, the lens may be rotated to test lens properties at another lens region.

I claim:

1. An apparatus to characterize a performance of an optical lens comprising:
   a beam of scanned light which scans across said lens;
   a light sensor for receiving said beam after said beam passes through said lens, said sensor generating a signal which is proportional to an amount of said beam striking said sensor;
   an encoder positioned between said lens and said sensor to encode said light passing through to said sensor, said beam travelling across a window having a transparent opening disposed on an opaque face of said encoder, said opening having a plurality of sawtooth shaped openings such that said amount of said beam penetrating through said opening to said sensor as said beam scans across said lens is made to vary due to said sawtooth shaped openings, said encoding provided by said beam transitioning between opaque and transparent regions of said face;
   a means coupled to said sensor for determining a rate of change of said signal in respect to a scanning time of said beam travelling across said sawtooth shaped opening;
   whereby distortion caused by said lens is determined.

2. The apparatus as defined in claim 1, wherein rising edges of said sawtooth openings further include a plurality of ramped steps, such that more of said beam penetrates to said sensor at each subsequent step as said beam scans across said sawtooth opening.

3. The apparatus as defined in claims 1 or 2, wherein said face of said encoder further includes a second window having a plurality of transparent openings located therein, said second window used to align said encoder in position in respect to said beam.

4. The apparatus as defined in claim 3, wherein a laser is used as a source of said beam.

5. The apparatus as defined in claim 4, wherein said scanning is performed by reflecting said laser from a rotating mirror.

6. The apparatus as defined in claim 5, wherein said beam is used to scan across a lens assembly having a plurality of lenses.

7. The apparatus as defined in claim 3, wherein said determining means is comprised of a processor to quantify said amount of light passing to said sensor.

8. An apparatus for characterizing the performance of an optical lens comprising:
   a beam of scanning light which scans across said lens;
   a light sensor for receiving said beam after said beam passes through said lens, said sensor generating a signal which is proportional to an intensity of said beam striking said sensor;
   an encoder positioned between said lens and said sensor to modulate an amount of said light passing through to said sensor,
   (a) a face of said encoder being perpendicular to said beam;
   (b) said face being opaque and preventing penetration of said beam;
   (c) said face including a window having sawtooth shaped openings therein, wherein said openings permit encoding of said beam by controlling said light penetrating to said sensor;
   (d) said scanning causing said beam to travel across said window, such that more of said beam penetrates through to said sensor as said beam scans across each tooth of said sawtooth opening;
   a processor coupled to said light sensor to determine a rate of change of said signal in respect to time, such that said rate of change at a trailing edge of each of said sawtooth opening having a Gaussian distribution of uniformly spaced peaks if no distortion is present;
   whereby said distortion caused by said lens is determined.

9. The apparatus as defined in claim 8, wherein a rising edge of each of said sawtooth openings having a plurality of ramped steps, such that more of said beam penetrates to said sensor at each subsequent step as said beam scans along said opening.

10. The apparatus as defined in claim 9, wherein said processor deconvolutes said signal at each ramped step and determines distortion caused by said beam.

11. The apparatus as defined in claim 10, wherein said processor determines astigmatism of said lens.

12. The apparatus as defined in claim 10, further including a second window having a plurality of transparent openings located therein, said second window used to align said encoder in position with respect to said beam.

13. The apparatus as defined in claim 12, wherein said second window openings are arranged in a row and separated by portions of said opaque face, said opaque portions causing a dip of said light reception when said beam scans across said second window openings, said dips being uniform when said encoder is properly aligned to said beam.

14. The apparatus as defined in claim 13, wherein a laser is used as a source of said beam and said scanning is performed by reflecting said laser from a rotating mirror.

15. The apparatus as defined in claims 8 or 14, wherein said processor further includes a digitizer and a storage device coupled to said processor.

16. The apparatus as defined in claim 10, wherein each of said sawtooth openings having 30 steps, each said step having a height of 0.1 microns and a length of 3 microns.

17. A method to characterize a performance of an optical lens, said method comprising the steps of:
   scanning a beam of light across a face of said lens;
   encoding said beam of light after passing through said lens, said encoding provided by a transparent window having a plurality of sawtoothed shaped openings upon an opaque face, wherein said scanning causes said beam to travel across said window such that an amount of said beam penetrating through said window as said beam scans across said lens is dependent on said sawtoothed shaped openings;
   receiving of said beam passing through said window by using a light sensor, wherein said light sensor generates a signal proportional to an amount of encoded light received;
   quantifying said signal to determine a rate of change of said signal in respect to a scanning time of said beam travelling across said sawtooth shaped openings such that said quantified result is compared to an expected undistorted result;
   whereby a distortion caused by said lens is determined.

18. The method as defined in claim 17, wherein said scanned beam travels alternately across said opaque face and said transparent window, said quantifying step further comprising the step of determining a rate of change of said signal in respect to time at such crossovers, and said rate of change having a Gussian distribution of uniformly spaced peaks if no said distortion is present.

19. The method as defined in claim 18, wherein a trailing edge of each of said sawtooth shaped opening is used as each of said cross-overs.

20. The method as defined in claim 19, wherein a rising edge of each said sawtooth opening includes a plurality of ramped steps, such that as said beam travels across said ramped steps a predetermined portion of said beam is exposed to said sensor at each said step when said beam is not distorted.

21. The method as defined in claim 20, wherein said quantifying step further includes a deconvoluting step of said signal.

22. The method as defined in claim 21, wherein astigmatism of said lens is measured.

23. The method as defined in claim 17, wherein said scanned beam travels alternately across said opaque face and a second window having a plurality of transparent openings separated by opaque areas, said quantifying step further comprising the step of determining a signal dip at opaque portions as said beam travels across said second window, said dips being uniform when said beam is aligned with said second window.

24. The method as defined in claim 23, wherein said second window is comprised of a row of transparent rectangular openings.

* * * * *

UNITED STATES PATENT AND TRADEMARK OFFICE
CERTIFICATE OF CORRECTION

PATENT NO. : 4,767,215

DATED : 08/30/88

INVENTOR(S) : Borodovsky

It is certified that error appears in the above-identified patent and that said Letters Patent is hereby corrected as shown below:

Title page:

[73] Assignee delete "Ateoq" insert --Ateq--

Signed and Sealed this

Tenth Day of January, 1989

*Attest:*

DONALD J. QUIGG

*Attesting Officer*      *Commissioner of Patents and Trademarks*